United States Patent
Huwer et al.

(10) Patent No.: US 9,250,307 B2
(45) Date of Patent: Feb. 2, 2016

(54) MAGNETIC RESONANCE SYSTEM AND METHOD TO GENERATE DIFFUSION INFORMATION

(75) Inventors: Stefan Huwer, Erlangen (DE); David Andrew Porter, Poxdorf (DE)

(73) Assignee: Siemens Aktiengesellschaft, Munich (DE)

( * ) Notice: Subject to any disclaimer, the term of this patent is extended or adjusted under 35 U.S.C. 154(b) by 489 days.

(21) Appl. No.: 13/439,050

(22) Filed: Apr. 4, 2012

(65) Prior Publication Data
US 2012/0259199 A1    Oct. 11, 2012

(30) Foreign Application Priority Data
Apr. 6, 2011 (DE) .......... 10 2011 006 851

(51) Int. Cl.
| | |
|---|---|
| A61B 5/055 | (2006.01) |
| G01R 33/34 | (2006.01) |
| G01R 33/563 | (2006.01) |
| G01R 33/565 | (2006.01) |
| G06T 5/50 | (2006.01) |

(52) U.S. Cl.
CPC .... G01R 33/56341 (2013.01); G01R 33/56509 (2013.01); G01R 33/56536 (2013.01); G06T 5/50 (2013.01); G06T 2207/10088 (2013.01); G06T 2207/30008 (2013.01)

(58) Field of Classification Search
CPC ............... G01R 33/56509; G01R 33/56541; G01R 33/56336; G06T 5/50; G06T 2207/10088; G06T 2207/30008
See application file for complete search history.

(56) References Cited

U.S. PATENT DOCUMENTS

| | | | |
|---|---|---|---|
| 5,329,925 A | 7/1994 | NessAiver | |
| 5,539,310 A | 7/1996 | Basser et al. | |
| 5,997,883 A | 12/1999 | Epstein et al. | |
| 7,358,730 B2 * | 4/2008 | Mistretta et al. | 324/307 |
| 7,804,988 B2 | 9/2010 | Flohr et al. | |
| 2001/0007424 A1 * | 7/2001 | Kabasawa et al. | 324/312 |
| 2006/0229856 A1 * | 10/2006 | Burrus et al. | 703/11 |
| 2008/0061779 A1 * | 3/2008 | Feiweier | 324/307 |
| 2010/0137703 A1 | 6/2010 | Kabasawa | |

OTHER PUBLICATIONS

Pierpaoli, Carlo, and Peter J. Basser. "Toward a quantitative assessment of diffusion anisotropy." Magnetic resonance in Medicine 36.6 (1996): 893-906.*

(Continued)

Primary Examiner — Long V Le
Assistant Examiner — Helene Bor
(74) Attorney, Agent, or Firm — Schiff Hardin LLP (57) ABSTRACT

In a magnetic resonance (MR) method and system for the generation of diffusion information, diffusion-weighted MR images of an examination subject are generated, each image being generated using an individual diffusion gradient. The diffusion gradients, and therefore the MR images, are sorted such that, after the sorting, a predefined number of diffusion gradients respectively forms a group. Each diffusion gradient belongs to at least one of these groups, and the diffusion gradients of the respective same group are all as linearly independent of one another as possible. The MR images whose diffusion gradients form a group are assembled into an MR result image. Spatial transformations between the MR result images are determined, and the MR images are modified using these spatial transformations. The diffusion information is formed with the aid of the modified MR images.

16 Claims, 3 Drawing Sheets

(56) References Cited

OTHER PUBLICATIONS

Frank et al: "Characterization of Anisotrophy in High Angular Resolution Diffusion-Weighted MRI"; Magnetic Resonance in Medicine 47:1083-1099 (2002).

Tuch et al: "Q-Ball Imaging"; Magnetic Resonance in Medicine 52:1358-1372 (2004).

Tournier et al: "Direct estimation of the fiber orientation density function from diffusion-weighted MRI data using spherical deconvolution"; Neuroimage, Nov. 2004;23(3): 1176-85.

Wedeen et al: "Mapping Complex Tissue Architecture With Diffusion Spectrum Magnetic Resonance Imaging"; Magnetic Resonance in Medicine 54:1377-1386 (2005).

Rohde et al: "Comprehensive Approach for Correction of Motion and Distortion in Diffusion-Weighted MRI"; Magnetic Resonance in Medicine 51:103-114 (2004).

Friston et al: "Spatial Registration and Normalization of Images"; Human Brain Mapping 2:165-189 (1995).

Basser et al: "Diffusion-tensor MRI: theory, experimental design and data analysis—a technical review"; NMR Biomed 15:456-467 (2002).

Pluim et al: "Mutual information based registration of medical images: a survey"; IEEE Transactions on Medical Imaging (2003).

Thesen et al: "Prospective Acquisition Correction for Head Motion With Image-Based Tracking for Real-Time fMRI"; Magnetic Resonance in Medicine 44:457-465 (2000).

Jones et al: "Isotropic Resolution Diffusion Tensor Imaging With Whole Brain Acquisition in a Clinically Acceptable Time"; Human Brain Mapping 15:216-230 (2002).

Pipe et al: "Multishot Diffusion-Weighted FSE Using Propeller MRI"; Magnetic Resonance in Medicine 47:42-52 (2002).

Porter et al: "High Resolution Diffusion-Weighted Imaging Using Readout-Segmented Echo-Planar Imaging, Parallel Imaging and a Two-Dimensional Navigator-Based Reacquisition"; Magnetic Resonance in Medicine 62:466-475 (2009).

Pipe: "Motion Correction With Propeller MRI: Application to Head Motion and Free-Breathing Cardiac Imaging"; Magnetic Resonance in Medicine 42:963-969 (1999).

Jezzard et al: "Characterization of and Correction for Eddy Current Artifacts in Echo Planar Diffusion Imaging"; MRM 39:801-812 (1998).

Papadakis et al: "k-Space Correction of Eddy-Current-Induced Distortions in Diffusion-Weighted Echo-Planar Imaging"; Magnetic Resonance in Medicine 53:1103-1111 (2005).

Özcan: "(Mathematical) necessary conditions for the selection of gradient vectors in DTI", J. Magn. Reson. 172, pp. 238-241 (2005).

* cited by examiner

C

MAGNETIC RESONANCE SYSTEM AND METHOD TO GENERATE DIFFUSION INFORMATION

BACKGROUND OF THE INVENTION

1. Field of the Invention

The present invention concerns a method in order to generate and correspondingly present diffusion information (diffusion-weighted MR images, for example) by operation of a magnetic resonance system, as well as a correspondingly designed magnetic resonance system.

2. Description of the Prior Art

In routine clinical practice, diffusion-weighted magnetic resonance (MR) images supply important diagnostic information in stroke and tumor diagnostics. In diffusion-weighted imaging (DWI), diffusion gradients are switched (activated) in specific directions, and the diffusion of water molecules along the applied diffusion gradients attenuates the measured magnetic resonance signal. In areas with lower diffusion, a lower signal attenuation thus takes place, so that these areas are imaged with higher image intensity in an imaging magnetic resonance tomography (MRT) measurement (data acquisition). The strength of the diffusion weighting is thereby correlated with the strength of the applied diffusion gradient. The diffusion weighting can be characterized with an attribute known as the b-value, which is a function of gradient parameters (for example the gradient strength, the duration with which the diffusion gradients are applied, or the interval between the applied diffusion gradients).

In diffusion-weighted MR measurements, there is also the possibility to examine the orientation dependencies of the diffusion. In this form of diffusion imaging, multiple MR images (30 to multiple 100s) are normally acquired with different diffusion directions (directions of the diffusion gradients) and combined with one another in order to calculate parameter maps (ADC ("Apparent Diffusion Coefficient") or FA ("Fractional Anisotropy")), for example. These data are also used in "Diffusion Tractography" studies, for example in order to obtain information about the anatomy of nerve tracts. The time duration to acquire such diffusion-weighted MR image series is normally between 5 and 20 min, but can also be longer. Since the diffusion-weighted MR images are generated in chronological order during this time period, the numerous diffusion-weighted MR images must subsequently be brought into registration in order to take a movement of the subject into account. The registration of two or more MR images means the implementation of an algorithm or procedure in which MR images that depict the same subject are brought into congruence with one another in the best possible manner. This registration proceeds in two parts: the first part is a motion detection in order to determine a spatial transformation that describes the relative positions and orientations of the two images; the second part is a "regridding", wherein the spatial transformation is used in order to bring the position and orientation of the subject in the two images into agreement. An incorrect consideration of a subject movement leads to a flawed calculation of the diffusion results or diffusion information.

In U.S. Pat. No. 5,539,310 subject movement is detected by means of a cost function that depends only slightly on contrast changes of the MR images. Such a method shows poor results in the registration of MR images specifically at high b-values, since the image contrast has a strong dependence on the direction of the diffusion gradients.

The article "Comprehensive Approach for Correction of Motion and Distortion in Diffusion-Weighted MRI", G. K. Rhode et al., Magnetic Resonance in Medicine 51: 103-114, (2004) also describes a cost function that is based on the so-called transinformation ("mutual information") of the MR images to be registered. This cost function is used in order to register the diffusion-weighted MR images.

The article "Spatial Registration and Normalization of Images", K. J. Friston et al., Human Brain Mapping 2:165-189, (1995) discloses an error-squared cost function that is used in functional magnetic resonance imaging, for example.

According to "Characterization of Anisotropy in High Angular Resolution Diffusion-Weighted MRI", L. R. Frank et al., Magnetic Resonance in Medicine 47: 1083-1099, from 2002, a series of first MR images acquired with a b-value=0 is interleaved with an acquisition of second MR images with a high b-value. The first MR images are brought into registration with one another, and the parameters obtained from this registration are used in the registration of the second MR images. This method has a low temporal resolution since in general only a few first images (with a b-value=0) are acquired, such that the time interval between two successive first images is relatively large.

SUMMARY OF THE INVENTION

An object of the present invention is to generate diffusion-weighted MR images such that the registration of the generated diffusion-weighted MR images leads to fewer problems than is the case according to the prior art.

Within the scope of the present invention, a method is provided to generate diffusion information includes.

Diffusion-weighted MR images of an examination subject are generated, each being generated with an individual or different diffusion gradient. Each MR image accordingly has its own diffusion gradient with which the diffusion information contained in this MR image is generated.

The MR images (and therefore the respective diffusion gradients) are sorted such that each of the diffusion gradients (and therefore the corresponding MR images) belongs to at least one group. Each of these groups has the same prearranged number of diffusion gradients or MR images. The diffusion gradients (MR images) are associated with the individual groups such that the diffusion gradients within a group are all as linearly independent of one another as possible.

The MR images in the same group are combined into an MR result image, thereby producing one result image for each group.

A motion detection algorithm is used in order to determine spatial transformations (changes) between respective MR result images. This means that the movement of a subject shown in the MR result images (and therefore in the MR images) is detected, and this movement is described using the spatial transformations.

The spatial transformations are used in order to adapt positions and orientations of the corresponding MR images (for example positions and orientations of a subject shown in by the MR images) to the detected movement, and to modify the corresponding MR images accordingly. In particular, a spatial transformation is determined between a previous MR result image and a current MR result image. This spatial transformation is then used in order to adapt the MR images of the current MR result image to the detected movement.

The diffusion information is generated from the modified MR images.

The steps cited above do not need to be implemented in the order set forth above. According to a preferred embodiment according to the invention, the diffusion gradients are first sorted and the MR images are subsequently (after the sorting) generated (in particular in a chronological order which corresponds to the order of the sorted diffusion gradients).

To implement the sorting of the diffusion gradients or MR images only after the generation of the MR images can in particular be reasonable when the relative motion between the MR images of the same group is not too great.

Because the diffusion gradients (and therefore the MR images) are grouped such that the diffusion gradients within the same group are all as linearly independent of one another as possible, the MR result images that result from the combined from the MR images of the same group all have a similar contrast. In other words: the contrast of an MR result image that results from the MR images of one of the groups is nearly the same as a contrast of another MR result image that results from the MR images of another of the groups. Since the registration of MR images which have a similar contrast is significantly simpler or significantly more robust (less error-prone), the registration of the MR images sorted according to the invention leads to a significantly better result than if the MR images were not sorted according to the invention.

The following Equation (1) serves to determine the diffusion gradients (and therefore the diffusion-weighted MR images) of a group:

$$\ln\left(\frac{A(b)}{A(0)}\right) = -\sum_{i=1}^{3}\sum_{j=1}^{3} b_{ij} D_{ij} \quad (1)$$

wherein $D_{ij}$ is a component of the symmetrical diffusion tensor D, and $b_{ij}$ are known measurement parameters that are dependent on the diffusion gradients to be determined. $A(0)$ is the signal amplitude in a non-diffusion-weighted MR image, and $A(b)$ is the signal amplitude of a diffusion-weighted MR image with the b-matrix b. Since the diffusion tensor D is symmetrical, $D_{ij}=D_{ji}$ applies, such that 7 unknown parameters (the 6 different components $D_{ij}$ and $A(0)$) must be defined, which is possible via a corresponding equation system.

According to the invention, the property of the diffusion tensor D is utilized that the trace of said diffusion tensor is invariant relative to a rotation of said diffusion tensor D. The diffusion gradients are sorted so that a trace-weighed MR result image can be calculated with the aid of the directions (i.e. diffusion gradients) of a group. This MR result image has the property that the contrast is independent of the absolute directions of the diffusion gradients in the group.

So that Equation (1) can be satisfied, the diffusion gradients of the same group must satisfy certain conditions, which is learned from the article "(Mathematical) necessary conditions for the selection of gradient vectors in DTI", by A. Özcan, J. Magn. Reson. 172, Pages 238-241, 2005. For example, at least 6 diffusion gradients must satisfy the following properties, wherein it is to be taken into account that 6 diffusion gradients must satisfy all of the following conditions while, given groups with more than 6 diffusion gradients, some of the following rules may also be violated.

1. Two diffusion gradients of the same group may not be parallel or anti-parallel. This means that a diffusion gradient of the same group may not be a (positive or negative) multiple of another diffusion gradient of the same group.

2. If three diffusion gradients of the same group lie in the same plane (meaning that the three diffusion gradients are coplanar, such that the three possible intersection products are collinear), the remaining three diffusion gradients of this group must then be linearly independent. Expressed in a different way: the remaining three diffusion gradients may not be coplanar (i.e. may not lie in the same plane).

3. At most three diffusion gradients of the same group may lie in the same plane or be coplanar. Expressed in a different way: four diffusion gradients of the same group may not lie in the same plane or be coplanar.

The preferred implementation of this method comprises three diffusion gradients that are perpendicular to one another. In this case, a trace-weighted MR result image can be calculated via the geometric mean of the three MR images.

Expressed in a different way: the signal (the pixel value) for a defined pixel in each MR image of the same group has an exponential dependency on the diffusion coefficients along the direction of the diffusion gradient corresponding to the respective MR image. The geometric mean of the pixel values of the three MR images of the same group for a defined pixel has an exponential dependency on the sum of the diffusion coefficients of the directions of the three orthogonal diffusion gradients of the same group. The sum of the three diffusion coefficients corresponds to the trace (the track or primary diagonal—top left to bottom right—of the diffusion tensor D) of the diffusion tensor, which leads to the expression "trace-weighted MR result image".

As described above, for the case of three orthogonal diffusion gradients the combination of the MR images of the same group into the "trace-weighted" MR result image can takes place such that, for example, each pixel value of a defined pixel of the MR result image corresponds to the geometric mean of the pixel values of this defined pixel of the corresponding MR images. Given the three MR images in each group, the pixel value of the cube root of the product corresponds to the three pixel values of the three MR images. Given more than six MR images in each group, the combination of the MR images of the same group into the "trace-weighted" MR result image could take place such that Equation (1) is solved for the seven unknown parameters, and a "trace-weighted" MR result image is calculated from this.

As noted above, there are two different variants of the invention:

According to the preferred first variant, the diffusion gradients are sorted according to the invention before the acquisition of the MR images. The diffusion-weighted MR images are therefore already acquired in the sorted order in that the MR images of the same group are directly acquired in succession.

According to the more general second variant, the diffusion-weighted MR images are acquired in an arbitrary order. Only after the acquisition are the MR images sorted according to the invention, the MR result images generated and these MR result images registered (meaning that the spatial transformations are determined).

Since the probability of a subject movement is greater the longer the time interval between the acquisition points in time of the MR images, the first variant has advantages relative to the second variant.

However, it is noted that the present invention can also advantageously be used when already generated diffusion-weighted MR images (which thus have not been acquired in the order according to the invention) should be registered.

According to an embodiment of the invention, the diffusion-weighted MR images are generated with a first b-value. Further diffusion-weighted MR images are additionally generated with a second b-value, wherein the second b-value is smaller than the first b-value. The MR result images are directly registered with the additional MR images according to this embodiment.

The MR images with the second (small, for example in a range from 0 to 50 s/mm$^2$) b-value can be registered with one another without any problems since their contrast is the same (or very similar). Conversely, since the contrast of these images is very different in comparison to the contrast of the MR images with the first (high) b-value, the MR images with different b-values cannot be easily registered.

According to a further embodiment according to the invention, the diffusion-weighted MR images are generated with a first b-value. Additional diffusion-weighted MR images are in turn generated with a second b-value which is smaller than the first b-value. As in the previous embodiment, the additional diffusion-weighted MR images are in particular acquired between the acquisition of the diffusion-weighted MR images with the first b-value. According to this further embodiment, information which was derived in the registration of the MR result images is used to register the additional MR images.

In the registration of the MR result images, information is obtained which, for example provides information about how the subject has moved between the acquisition point in time of one MR result image and the acquisition point in time of the other MR result image. Since the additional MR images are acquired interleaved into the acquisition of the MR images, this movement information also applies to the additional MR images and can therefore advantageously be used to register these additional MR images.

According to a variant of this additional embodiment according to the invention, a preregistration of the additional MR images is implemented, wherein a first movement information is derived. In this preregistration, (in particular only) all MR images with the second (small) b-value are registered with one another. A second movement information is derived in the registration of the MR result images with the first (high) b-value. The actual registration of the additional MR images is implemented by means of movement parameters which best correspond to both the first movement information and the second movement information.

The predetermined number of diffusion gradients which respectively form a group is advantageously 3. In this case, the diffusion gradients of a group are then mutually as linearly independent of one another as possible when the three diffusion gradients are mutually situated optimally orthogonal to one another.

In order to sort the diffusion gradients such that the diffusion gradients of each group are optimally orthogonal to one another, for each group an index can be calculated which is smaller the more precisely that the diffusion gradients of the same group should be mutually orthogonal to one another. A sum of the indices of all groups then indicates a measure of how well the sorting criterion according to the invention has been fulfilled. For example, the diffusion gradients can be sorted such that this sum is as small as possible.

An additional possibility for sorting of the diffusion gradients according to the invention exists in the requirement that the following Equation (2) is satisfied for each group of diffusion gradients:

$$\max(|DV_1 \cdot DV_2|, |DV_1 \cdot DV_3|, |DV_2 \cdot DV_3|) < S \qquad (2),$$

wherein max(a,b,c) is a function that returns the maximum of a, b and c as a function value. $DV_i$ is the i-th diffusion gradient of the respective group, normalized to the length 1, and S is a threshold. The diffusion gradients are now assigned to the individual groups such that the threshold S is optimally small.

A search algorithm which has produces a sorting of the diffusion gradients DV such that the diffusion gradients of all groups satisfy Equation (or more accurately Inequality) (2) varies the threshold S in order to find a solution. The optimal (minimum) value of the threshold S depends on the one hand on the predetermined diffusion gradient and on the other hand on to how many groups the same diffusion gradient belongs.

According to the invention, the possibility exists that the same diffusion gradient belongs to multiple groups. For example, it is possible that every second diffusion gradient belongs to two groups. It is also possible that, with the exception of the two first diffusion gradients and the two last diffusion gradients (after the sorting), each diffusion gradient belongs two three groups.

These variants should be explained in detail in the following. It is thereby assumed that the groups (and therefore the diffusion gradients of the groups) are arranged in succession.

The variant—that each second diffusion gradient belongs to two groups—can be represented so that the respective third diffusion gradient of each group is simultaneously the first diffusion gradient of the group following this group.

In this variant, the diffusion gradients of the same group can be arranged orthogonal to one another, although stronger restrictions exist with regard to the arrangement of all diffusion gradients in the order according to the invention than if each diffusion gradient belongs to only one group. In comparison to the variant that each diffusion gradient belongs to only one group, in this variant the time resolution is improved since a motion detection (and therefore a motion correction) is possible after each second diffusion-weighted MR image (and not only after each third diffusion-weighted MR image) since an MR result image is combined from three MR images after each second acquired MR image.

The variant—that each diffusion gradient belongs to three groups, with the exception of the two first/last diffusion gradients—can be represented so that the second diffusion gradient of each group also belongs to the preceding and subsequent group. The first diffusion gradient of each group then also belongs to the two preceding groups, and the third diffusion gradient of each group then also belongs to the two subsequent groups.

In this variant, the diffusion gradients of the same group cannot really be arranged orthogonal to one another (rather can only be arranged as orthogonal as possible). However, in comparison to the variant that each diffusion gradient belongs to only one group, or also in comparison to the variant that each second diffusion gradient belongs to two groups, the time resolution in the motion detection or motion correction is additionally improved since this motion detection or motion correction is now possible after each diffusion-weighted MR image. (After each acquired MR image, a new MR result image is calculated that is composed from this MR image and the two previous.)

The diffusion gradients are advantageously determined such that a distribution of the directions of the diffusion gradients is optimally distributed uniformly in space. For example, if the diffusion gradients are imagined as unit vectors of length 1 which respectively begin at the origin of the coordinate system, the points on a sphere with radius 1 and the origin as the center point should then be arranged as uniformly as possible on the sphere surface when the points correspond to the respective ends (the tips) of the respective unit vector.

The more uniform the distribution of the directions of the diffusion gradients, the simpler or better that the groups can respectively be provided with diffusion gradients which are essentially mutually orthogonal to one another.

According to a preferred embodiment of the invention, the registration of the diffusion-weighted MR images is conducted in real time, such that the motion detection also occurs in real time. The alignment of a current slice measured in the generation of the diffusion-weighted MR images can be adapted to the detected direction of movement. For example, for this the normal vector of the slice to be measured next (i.e. the vector that is orthogonal to this slice)—and therefore the slice itself—is modified such that the normal vector is arranged optimally parallel to the direction of the detected motion.

In the present invention, a repeated scanning technique ("multi-shot") can be used to generate the diffusion-weighted MR images. Navigator signals which are detected at each scan step of the repeated scan via a scanning of the center of k-space are detected to correct phase errors which are induced by a movement, for example. The registration of the MR images is then implemented depending on information which was obtained via these navigator signals.

Various navigator measurement methods exist. In some of these navigator measurement methods, the navigator (for example the navigator signals) is detected before the actual scanning step (thus before the acquisition of the actual k-space segment). In others of these navigator measurement methods, the measurement of the navigator takes place after the actual scanning step. Moreover, the navigator data or the navigator signals can also be a component of the actual k-space segment to be measured, such that the navigator signals are essentially detected within the framework of the scanning step (corresponding navigator measurement methods are also called self-navigator methods).

These navigator signals provide MR images of a comparably low resolution in that the center of k-space is scanned at or, respectively, before each shot (acquisition). A spatially incorrect registration due to movement can be avoided or corrected via the information obtained from the navigator signals.

In the multi-shot technique, multiple slices are in particular scanned in succession in that the same k-space segment is scanned for each slice before another k-space segment is scanned. The same k-space segment is scanned for all slices with the diffusion gradients of the same group before another k-space segment is scanned. Another k-space segment is accordingly only scanned when the k-space segment has been scanned with all diffusion gradients of the group for all slices.

By this procedure, the diffusion-weighted MR images that are created in such a manner have a time resolution (with which a correspondingly good motion detection is possible) similar to as given a single scan technique ("single shot").

The present invention also encompasses a magnetic resonance system to acquire MR image data. The magnetic resonance system has a basic field magnet, a gradient field system, an RF antenna, and a control device in order to control the gradient field system and the RF antenna, to receive measurement signals acquired by the RF antenna, to evaluate these measurement signals and thus to acquire diffusion-weighted MR images. The magnetic resonance system generates each diffusion-weighted MR image with its own (different) diffusion gradients. The magnetic resonance system thereby sorts the diffusion gradients (and thus the diffusion-weighted MR images) such that a predetermined number of these diffusion gradients respectively subsequently (after the sorting) forms a group. Each diffusion gradient thereby belongs to at least one of these groups. The diffusion gradients of the same group are mutually as linearly independent of one another as possible. The magnetic resonance system assembles those MR images whose diffusion gradients belong to the same group into an MR result image. The magnetic resonance system then determines spatial transformations between the MR result images and modifies the MR images depending on these spatial transformations. Finally, the magnetic resonance system determines a diffusion information via these MR images modified in such a manner.

The advantages of the magnetic resonance system according to the invention thereby correspond to the advantages of the method according to the invention as discussed above.

The above object also is achieved in accordance with the present invention by a non- by non-transitory, computer-readable data storage medium encoded with programming instructions. When the storage medium is loaded into a computerized control and evaluation system of a magnetic resonance system, the programming instructions cause the control and evaluation system to operate the magnetic resonance system to implement any or all of the above-described embodiments.

The programming instructions may require program means (for example libraries and auxiliary functions) in order to realize the corresponding embodiments of the method.

The software (programming instructions) can thereby be a source code (C++, for example) that must still be compiled (translated) and linked or that must only be interpreted, or it can be an executable software code that has only to be loaded into the corresponding computer for execution.

The electronically readable data medium may be, for example, a DVD, a magnetic tape or a USB stick on which is stored electronically readable control information, in particular software (see above).

The present invention significantly addresses the avoidance of contrast differences which occur between two MR images to be registered that have been acquired with diffusion gradients of different directions but up with the same b-value. According to the prior art, however, in addition to a large number of MR images which are generated with the same b-value, to determine a difference information a small number of MR images is generated with which other (very low, for example 0-50 s/mm$^2$) b-values are acquired. Methods to detect a diffusion information are also known in which MR images with more than two different b-values are generated. It should be noted that the registration of diffusion-weighted MR images which have been acquired with a b-value around 1000 s/mm$^2$ with MR images which have been generated with a low b-value (for example 0-50 s/mm$^2$) represents a significant challenge due to the large contrast differences between the MR images to be registered.

In this regard it should be noted that the registration of an MR result image created according to the invention with an MR image which has been created with a low b-value leads to fewer problems than the registration of an MR result image created according to the prior art with an MR image which has been created with a low B-value. Therefore, according to the invention it is possible to register an MR result image created according to the invention directly with an MR image which has been created with a low b-value.

In the event that a direct registration between an MR result image created according to the invention and an MR image created with a low b-value is not possible, the signal values of the MR image created with a low b-value can be artificially attenuated or weakened in order to generate a form of estimated trace-weighted MR image, which is then registered with the MR result image according to the invention that has generally been created with a high b-value (for example around 1000 s/mm$^2$). This attenuation or weakening is implemented with estimated values for an average diffusion capability of a tissue which coincides with the different tissue types (for example white or grey brain matter) in the MR image which has been created with the low b-value.

In some cases, it is necessary to combine the motion correction with a correction of an image distortion due to eddy current effects. This can be realized via a slice-specific registration method. However, problems in the registration of the diffusion-weighted MR result images most often occur via this approach. Therefore, according to the invention it is proposed in this case to use a method which uses calibration measurements via which k-space corrections are enabled during the data acquisition or during the image reconstruction.

The present invention is in particular suitable for generation of diffusion information in the form of MR images. Naturally, the present invention is not limited to this preferred field of application since the present invention is also usable in an arbitrary form to generate diffusion information.

DESCRIPTION OF THE PREFERRED EMBODIMENTS

Figure 1:
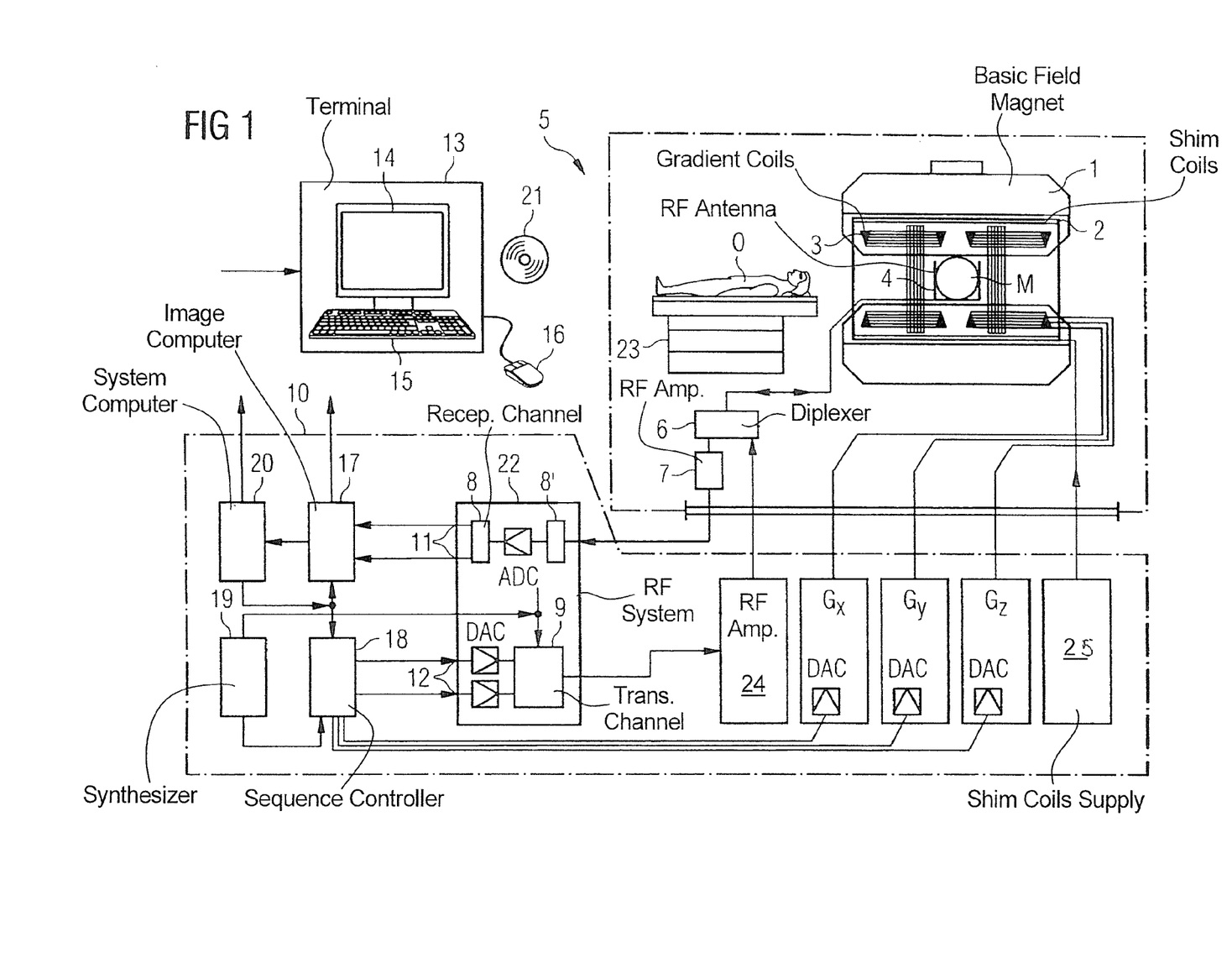
FIG. 1 schematically illustrates a magnetic resonance system according to the invention.

FIG. 1 is a schematic illustration of a magnetic resonance system 5 (a magnetic resonance imaging or magnetic resonance tomography apparatus). A basic magnetic field 1 generates a temporally constant, strong magnetic field for polarization or, respectively, alignment of the nuclear spins in an examination region of a subject O, for example of a portion of a human body (the head, for example) that is to be examined which, situated on a table 23, is moved into the magnetic resonance system 5 for data acquisition. The high homogeneity of the basic magnetic field that is required for the magnetic resonance measurement (data acquisition) is defined in a typically spherical measurement volume M. Shim plates made of ferromagnetic material are mounted at a suitable point to assist the homogeneity requirements to eliminate temporally invariable influences. Temporally variable influences are eliminated by shim coils 2, operate by a shim coils supply 25.

A cylindrical gradient coil system 3 composed of three sub-windings is located in the basic field magnet 1. Each sub-winding is supplied with current by an amplifier to generate a linear (and temporally variable) gradient field in the respective direction of the Cartesian coordinate system. The first sub-winding of the gradient field system 3 generates a gradient $G_x$ in the x-direction; the second sub-winding generates a gradient $G_y$ in the y-direction; and the third sub-winding generates a gradient $G_z$ in the z-direction. Each amplifier has a digital/analog converter which is activated by a sequence controller 18 for time-accurate generation of gradient pulses.

One (or more) radio-frequency antennas 4 that convert the radio-frequency pulses emitted by a radio-frequency power amplifier 24 into an alternating magnetic field for excitation of the nuclei and alignment of the nuclear spins of the subject O to be examined or, respectively, of the region of the subject O that is to be examined are located within the gradient field system 3. Each radio-frequency antenna 4 is composed of one or more RF transmission coils and one or more RF reception coils in the form of an annular, advantageously linear or matrix-like arrangement of component coils. The alternating field emanating from the precessing nuclear spins—i.e. normally the spin echo signals caused by a pulse sequence made up of one or more radio-frequency pulses and one or more gradient pulses—is also converted by the RF reception coils of the respective radio-frequency antenna 4 into a voltage (measurement signal) which is supplied via an amplifier 7 to a radio-frequency reception channel 8 of a radio-frequency system 22. The radio-frequency system 22 furthermore has a transmission channel 9 in which the radio-frequency pulses are generated for the excitation of the nuclear magnetic resonance. The respective radio-frequency pulses are digitally represented in the sequence controller 18 as a series of complex numbers based on a pulse sequence predetermined by the system computer 20. This number sequence is supplied as a real part and imaginary part to a digital/analog converter in the radio-frequency system 22 via respective inputs 12 and from the digital/analog converter to a transmission channel 9. In the transmission channel 9, the pulse sequences are modulated on a radio-frequency carrier signal whose base frequency corresponds to the resonance frequency of the nuclear spins in the measurement volume.

The switching from transmission operation to reception operation takes place via a transmission/reception diplexer 6. The RF transmission coils of the radio-frequency antenna(s) 4 radiate(s) the radio-frequency pulses for excitation of the nuclear spins into the measurement volume M and scans resulting echo signals via the RF reception coil(s). The correspondingly acquired nuclear magnetic resonance signals are phase-sensitively demodulated at an intermediate frequency in the reception channel 8' (first demodulator) of the radio-frequency system 22 and digitized in an analog/digital converter (ADC). This signal is further demodulated to a frequency of 0. The demodulation to a frequency of 0 and the separation into real part and imaginary part occurs in a second demodulator 8 after the digitization in the digital domain. An MR image can be reconstructed by the image computer 17 from the measurement data acquired in such a manner. The administration of the measurement data, the image data and the control programs takes place via the system computer 20. Based on a specification with control programs, the sequence controller 18 monitors the generation of the respective desired pulse sequences and the corresponding scanning of k-space. In particular, the sequence controller 18 thereby controls the time-accurate switching of the gradients, the emission of the radio-frequency pulses with defined phase amplitude and the reception of the magnetic resonance signals. The time base for the radio-frequency system 22 and the sequence controller 18 is provided by a synthesizer 19. The selection of corresponding control programs to generate an MR image (which control programs are stored on a DVD 21, for example) and the presentation of the generated MR image take place via a terminal 13 which comprises a keyboard 15, a mouse 16 and a monitor 14.

Figure 2:
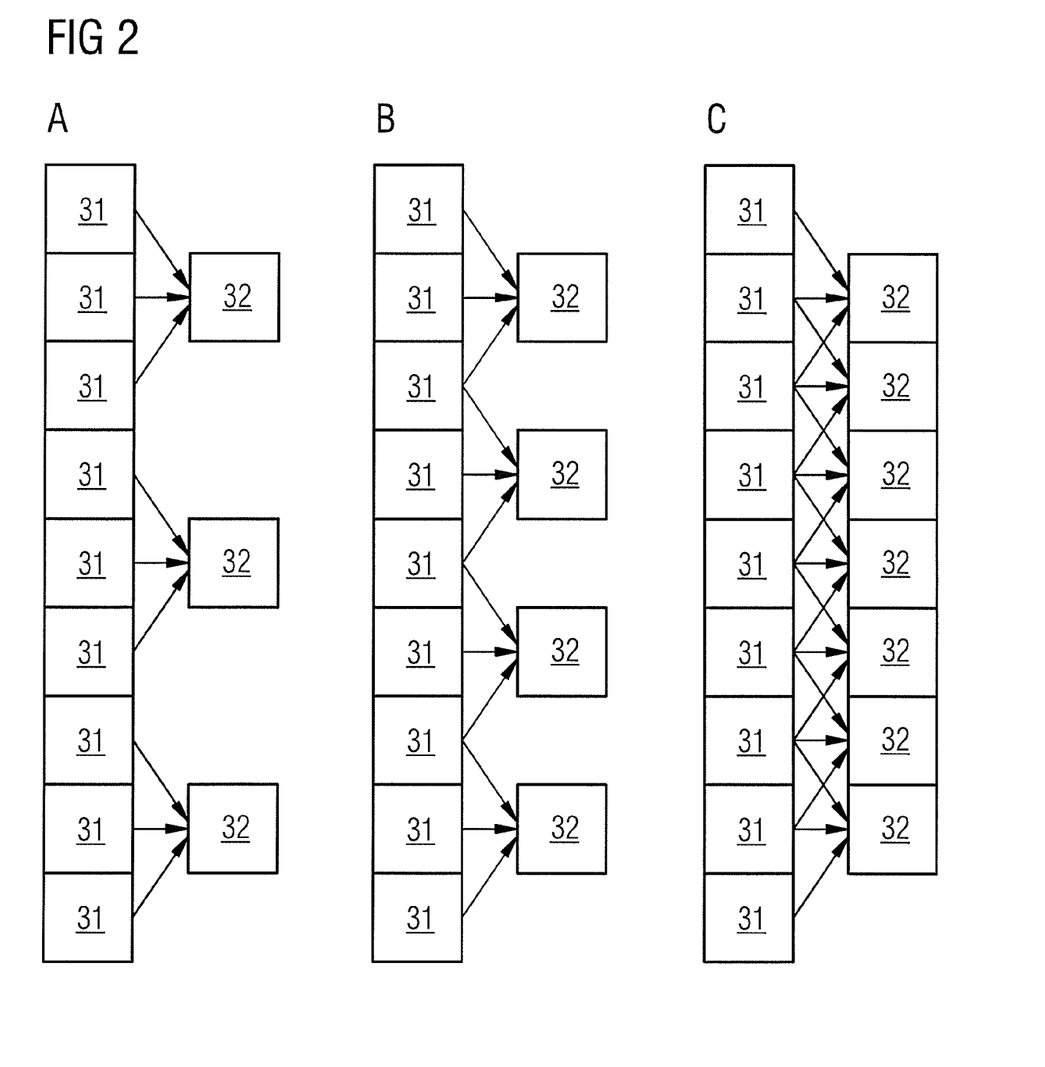
FIG. 2 schematically depicts variants that are possible according to the invention in the assignment of the diffusion gradients to individual groups.

How three respective diffusion gradients (and therefore diffusion-weighted MR images 31) can be associated with a group (and therefore a trace-weighted MR result image 32) is schematically depicted FIG. 2. In each of the three depicted variants A through C, the diffusion-weighted MR images 31 are associated with the respective trace-weighted MR result images 32 such that the diffusion gradients associated with the three diffusion-weighted MR images 31 are arranged optimally orthogonal to one another.

In variant A (see FIG. 2A), no diffusion gradients are apportioned to the individual groups 32 (MR result images 32) (no diffusion-weighted MR images 31); in variant B (see FIG. 2B), one diffusion-weighted MR image 31 is respectively apportioned to the individual MR result images 32; and in variant C (see FIG. 2C), two diffusion-weighted MR images 31 are respectively apportioned to the individual MR result images 32.

Figure 3:
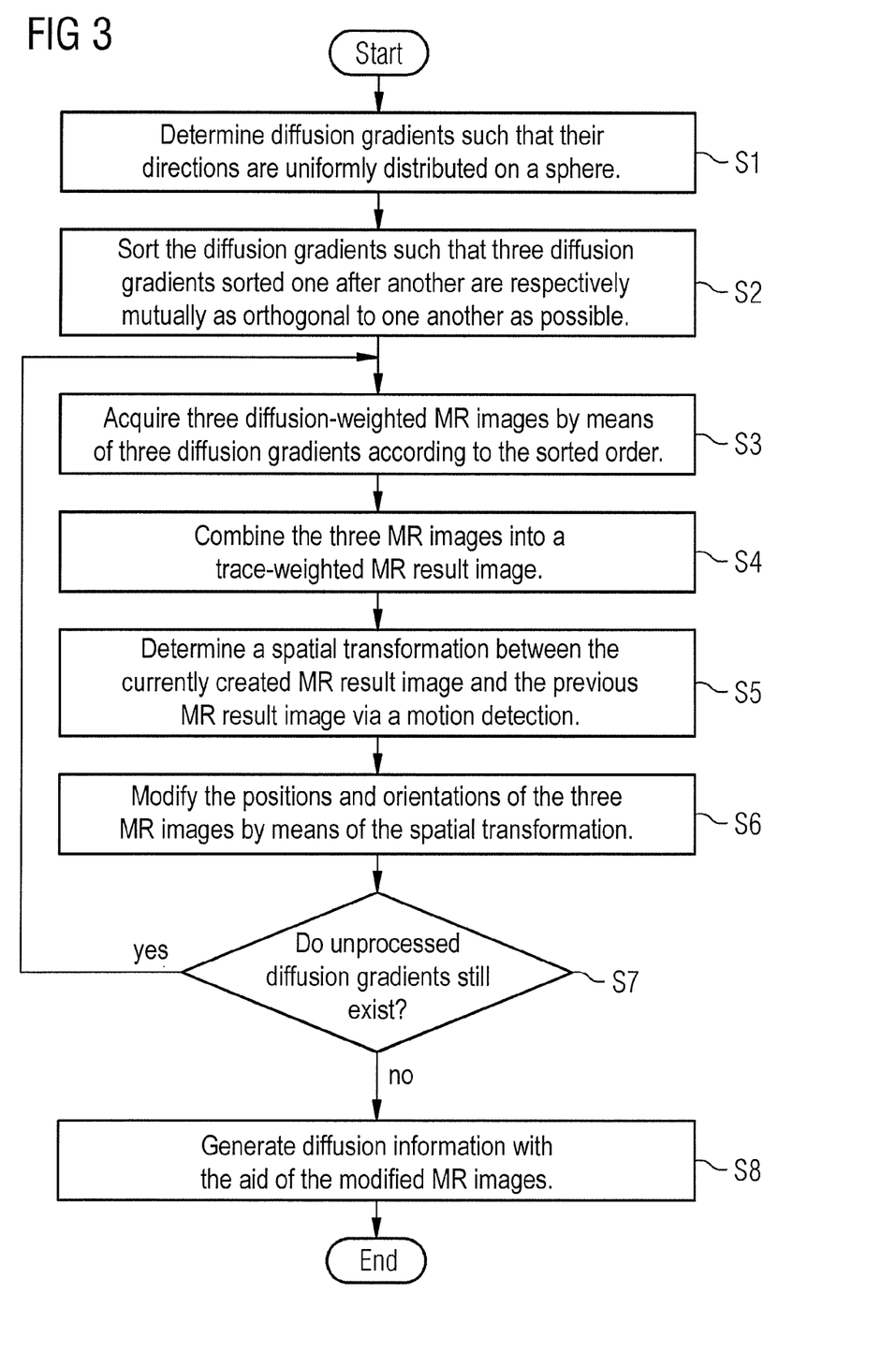
FIG. 3 is a flowchart of an embodiment of the method according to the invention.

A method according to the invention to generate diffusion information is presented in FIG. 3 as a workflow diagram.

In a first Step S1, numerous diffusion gradients (60, for example) are determined. A diffusion-weighted MR image is then created in Step S3 with each of these diffusion gradients. If each of these diffusion gradients begins at the origin and intersects a spherical surface of a sphere, wherein this sphere has its center point at the origin, each diffusion gradient then generates an intersection point on the spherical surface. The diffusion gradients are now selected such that these intersection points cover the spherical surface as uniformly as possible so that, for example, the distance between an intersection point and its nearest neighbor is optimally the same for each intersection point.

In a next Step S2, diffusion gradients are sorted into an order such that three diffusion gradients arranged one after another according to the order respectively form a group. The three diffusion gradients of the same group are thereby mutually as orthogonal to one another as possible, such that the absolute value of the scalar product of any two of these three diffusion gradients of the same group is as small as possible.

In the following Step S3, three diffusion-weighted MR images are generated using the three diffusion gradients of the same group.

These three diffusion-weighted MR images are combined in Step S4 into a trace-weighted MR result image. Since the MR result images 32 are respectively created by means of diffusion gradients which are mutually arranged optimally orthogonal to one another, all MR result images are the same in terms of their contrast. This means that the MR result images generated according to the invention advantageously have only slight contrast differences.

With respect to this current MR result image and the previous MR result image, in Step S5 a spatial transformation is determined which is also known as part of a registration. By means of this spatial transformation, subjects within the MR result image can be transformed into corresponding subjects in the previous MR result image, whereby a movement of these subjects between the previous MR result image and the current MR result image is taken into account. Since all MR result images are the same with regard to their contrast, at most a slight contrast difference exists between an MR result image and its predecessor MR result image, wherein the determination of the spatial transformation between the MR result image and its predecessor MR result image is advantageously facilitated.

In the next Step S6, this spatial transformation determined in Step S5 is now used in order to accordingly correct or adapt corresponding positions and orientations (in particular of subjects) in those three MR images from which the current MR result image has been created. Expressed in a different way: the spatial transformation determined in Step S5 is used in order to register the MR images.

In the event that it is determined at the query S7 that unprocessed diffusion gradients still exist (thus diffusion gradients with which no diffusion-weighted MR image has yet been created), the method returns to Step S3. Otherwise, the method continues at Step S8.

In this Step S8, a diffusion information is generated using the corrected or adapted MR images.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method to generate diffusion information representing diffusion of predetermined molecules in tissue of a subject, comprising:
   operating a magnetic resonance data acquisition unit, in which a subject is located, to obtain a plurality of diffusion-weighted magnetic resonance images of the subject, with each of said diffusion-weighted magnetic resonance images being generated with a respective, individual diffusion gradient;
   in a computerized processor, sorting the diffusion gradients to produce, after sorting, respective groups of said diffusion gradients with a predetermined number of said diffusion gradients in each group and each of said diffusion gradients belonging to at least one of said groups, to place diffusion gradients in respective groups of at least two diffusion gradients per group that are, within the respective groups, as linearly independent of each other as possible by having an absolute value of a scalar product of the at least two diffusion gradients that is minimal;
   in said processor, for each of said groups, combining the respective magnetic resonance images that were generated using the respective diffusion gradients in the respective group to form, for each group, a magnetic resonance result image;
   in said processor, determining spatial transformations between respective magnetic resonance result images that represent movement of said subject that exists in the respective magnetic resonance result images for which the spatial transformation is determined;
   in said processor, using the respective spatial transformations between respective magnetic resonance result images to modify the respective magnetic resonance result images to account for said movement in bringing the respective magnetic resonance result images into registration with each other;
   in said processor, forming diffusion information based on the modified magnetic resonance result images; and
   at a display in communication with said processor, displaying said magnetic resonance images with said diffusion information embodied therein.

2. A method as claimed in claim 1 comprising:
   sorting said diffusion gradients before obtaining said plurality of diffusion-weighted magnetic resonance images, and thereby defining respective magnetic resonance diffusion-weighted images associated with each group of diffusion gradients; and
   acquiring all magnetic resonance images associated with a same group of diffusion gradients in immediate succession.

3. A method as claimed in claim 1 comprising:
   obtaining said plurality of diffusion-weighted images with a first b-value;
   operating said magnetic resonance data acquisition unit to obtain additional diffusion-weighted magnetic resonance images with a second b-value that is smaller than said first b-value; and
   overlying said magnetic resonance result images directly in registration with said additional diffusion-weighted magnetic resonance images.

4. A method as claimed in claim 1 comprising:
   obtaining said plurality of diffusion-weighted magnetic resonance images with a first b-value;

operating said magnetic resonance data acquisition unit to obtain additional diffusion-weighted images with a second b-value that is smaller than said first b-value; and determining motion information representing movement of said subject when overlying said magnetic resonance result images in registration with each other, and using said motion information to bring said additional magnetic resonance images into registration with each other.

5. A method as claimed in claim 4 comprising:

overlying said additional magnetic resonance images in registration with each other and obtaining first movement information from the registration of said additional magnetic resonance images;

obtaining second movement information from the registration of said magnetic resonance result images; and determining movement parameters that best correspond to said first movement information and said second movement information and implementing a final registration of said additional magnetic resonance images using said movement parameters.

6. A method as claimed in claim 1 wherein said predetermined number of diffusion gradients in each group is three, and sorting said diffusion gradients to cause respective diffusion gradients in each group to be as orthogonal to each other as possible by having an absolute value of a scalar product of any two of the three diffusion gradients that is minimal.

7. A method as claimed in claim 6 comprising:

in said processor, calculating, for each group, an index that decreases dependent on a degree to which the three diffusion gradients in the respective group are orthogonal to each other;

calculating a sum of all respective indices for all of said groups; and sorting said diffusion gradients to make said sum as small as possible.

8. A method as claimed in claim 7 comprising:

in said processor, requiring each group to satisfy max (|DV1·DV2|,|DV1·DV3|,|DV2·DV3|) <S wherein max (a,b,c) is a function that returns the maximum of a, b and c as a function value, and wherein DVi is the i-th diffusion gradient of the respective group, normalized to the length 1, and S is a threshold; and sorting said plurality of diffusion gradients to make said threshold S as small as possible.

9. A method as claimed in claim 6 comprising defining or sorting said diffusion gradients to cause two successive groups of said diffusion gradients to include a same diffusion gradient in each of said two successive groups.

10. A method as claimed in claim 6 comprising sorting said diffusion gradients to cause two successive groups of said diffusion gradients to include two same diffusion gradients in both of said two successive groups.

11. A method as claimed in claim 1 comprising defining said diffusion gradients to cause a distribution of respective directions of said diffusion gradients to be as uniform as possible.

12. A method as claimed in claim 1 comprising overlying said magnetic resonance result images in registration with each other in real time and detecting a direction of said movement of said subject from the registration of the magnetic resonance result images; and for a current slice of said subject from which said diffusion-weighted magnetic resonance images are obtained, adapting a direction of said current slice dependent on said direction of movement.

13. A method as claimed in claim 1 comprising:

operating said magnetic resonance data acquisition unit with a multi-shot technique to generate said plurality of diffusion-weighted magnetic resonance images, said multi-shot technique comprising a plurality of scans that are subject to phase errors;

correcting said phase errors by scanning navigator signals in a center of k-space in each scan of said multi-shot technique; and implementing the registration of said magnetic resonance result images dependent on information obtained from said navigator signals.

14. A method as claimed in claim 1 comprising:

operating said magnetic resonance data acquisition unit with a multi-shot technique to acquire said plurality of diffusion-weighted magnetic resonance images by scanning multiple slices of the subject in succession with a k-space segment of each slice being scanned before an additional k-space segment of each slice is scanned;

scanning a same k-space segment for all of said slices with diffusion gradients in a same group before said additional k-space segment is scanned; and scanning said additional k-space segment only when said same k-space segment has been completely scanned with all diffusion gradients of said same group, for said slices.

15. A magnetic resonance apparatus to generate diffusion information representing diffusion of predetermined molecules in tissue of a subject, comprising:

a magnetic resonance data acquisition unit;

a control unit configured to operate said magnetic resonance data acquisition unit with a subject therein, to obtain a plurality of diffusion-weighted magnetic resonance images of the subject, with each of said diffusion-weighted magnetic resonance images being generated with a respective, individual diffusion gradient;

a computerized processor configured to sort the diffusion gradients to produce, after sorting, respective groups of said diffusion gradients with a predetermined number of said diffusion gradients in each group and each of said diffusion gradients belonging to at least one of said groups, to place diffusion gradients in respective groups of at least two diffusion gradients per group that are, within the respective groups, as linearly independent of each other as possible by having an absolute value of a scalar product of the at least two diffusion gradients that is minimal;

said processor being configured to, for each of said groups, combine the respective magnetic resonance images that were generated using the respective diffusion gradients in the respective group to form, for each group, a magnetic resonance result image;

said processor being configured to determine spatial transformations between respective magnetic resonance result images that represent movement of said subject that exists in the respective magnetic resonance result images for which the spatial transformation is determined;

said processor being configured to use the respective spatial transformations between respective magnetic resonance result images to modify the respective magnetic resonance result images to account for said movement in bringing the respective magnetic resonance result images into registration with each other;

said processor being configured to form diffusion information based on the modified magnetic resonance result images; and a display in communication with said processor, and said processor being configured to cause said magnetic resonance images to be displayed at said display with said diffusion information embodied therein.

16. A non-transitory, computer-readable data storage medium encoded with programming instructions, said storage medium being loaded into a computerized control and evaluation system of a magnetic resonance system that comprises a magnetic resonance data acquisition unit, said programming instructions causing said computerized control and evaluation system to:

operate the magnetic resonance data acquisition unit with a subject therein, to obtain a plurality of diffusion-weighted magnetic resonance images of the subject, with each of said diffusion-weighted magnetic resonance images being generated with a respective, individual diffusion gradient;

sort the diffusion gradients to produce, after sorting, respective groups of said diffusion gradients with a predetermined number of said diffusion gradients in each group and each of said diffusion gradients belonging to at least one of said groups, to place diffusion gradients in respective groups of at least two diffusion gradients per group that are, within the respective groups, as linearly independent of each other as possible by having an absolute value of a scalar product of the at least two diffusion gradients that is minimal;

for each of said groups, combine the respective magnetic resonance images that were generated using the respective diffusion gradients in the respective group to form, for each group, a magnetic resonance result image;

determine spatial transformations between respective magnetic resonance result images that represent movement of said subject that exists in the respective magnetic resonance result images for which the spatial transformation is determined;

use the respective spatial transformations between respective magnetic resonance result images to modify the respective magnetic resonance result images to account for said movement in bringing the respective magnetic resonance result images into registration with each other;

form diffusion information based on the modified magnetic resonance result images; and at a display of said control and evaluation system, displaying said magnetic resonance images with said diffusion information embodied therein.

* * * * *